United States Patent [19]
Ishigaki et al.

[11] 4,079,330
[45] Mar. 14, 1978

[54] SYSTEM FOR DEMODULATING ANGLE-MODULATED SIGNALS

[75] Inventors: Yukinobu Ishigaki, Yamato; Kohei Sasamura, Sagamihara; Yasuo Itoh, Tokyo; Teruo Muraoka, Sagamihara, all of Japan

[73] Assignee: Victor Company of Japan, Limited, Yokohama, Japan

[21] Appl. No.: 746,336

[22] Filed: Dec. 1, 1976

Related U.S. Application Data

[63] Continuation-in-part of Ser. No. 712,707, Aug. 9, 1976.

[30] Foreign Application Priority Data

| Aug. 15, 1975 | Japan | 50-98498 |
| Aug. 15, 1975 | Japan | 50-98499 |
| Dec. 2, 1975 | Japan | 50-142333 |
| Dec. 2, 1975 | Japan | 50-142334 |
| May 20, 1976 | Japan | 51-58301 |
| May 20, 1976 | Japan | 51-58302 |
| May 20, 1976 | Japan | 51-58303 |

[51] Int. Cl.² .............................................. H03D 3/22
[52] U.S. Cl. .................................. 329/134; 325/349; 329/136; 329/137
[58] Field of Search ............... 329/110, 131, 134, 136, 329/137, 145; 325/349

[56] References Cited

U.S. PATENT DOCUMENTS

| 2,835,802 | 5/1958 | Day | 325/349 X |
| 3,387,220 | 6/1968 | Lender | 329/145 X |
| 3,392,337 | 7/1968 | Neuburger | 329/110 X |
| 3,569,845 | 3/1971 | Steinberg | 329/110 |
| 3,792,357 | 2/1974 | Hekimian et al. | 325/349 X |

*Primary Examiner*—Siegfried H. Grimm

[57] ABSTRACT

The inventive system demodulates angle-modulated signals. A tracking band-pass filter responds to an input angle-modulated wave signal. The tracking filter has a pass band with a center frequency controlled by a control signal. A first amplitude limiter limits the amplitude of the input angle-modulated wave signal. A differentiation circuit establishes a 90° phase difference between a signal passing through the tracking band-pass filter and a signal passing through the amplitude limiter. A phase comparator responds to an input with the two signals with a 90° phase difference therebetween and produces an output error signal in accordance with this phase difference. This output error signal is supplied as the control signal to the tracking band-pass filter. This output error signal is also passed through a low pass filter to produce the demodulated signal.

5 Claims, 28 Drawing Figures

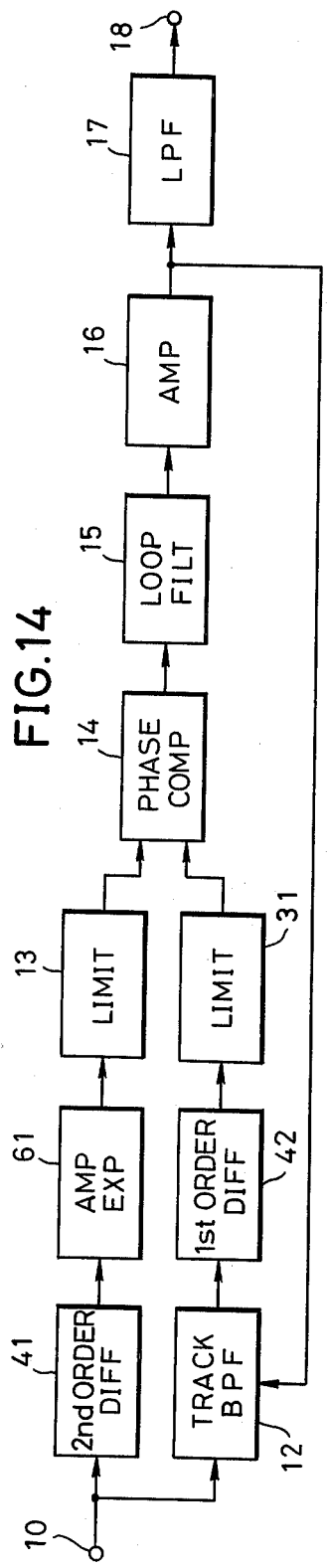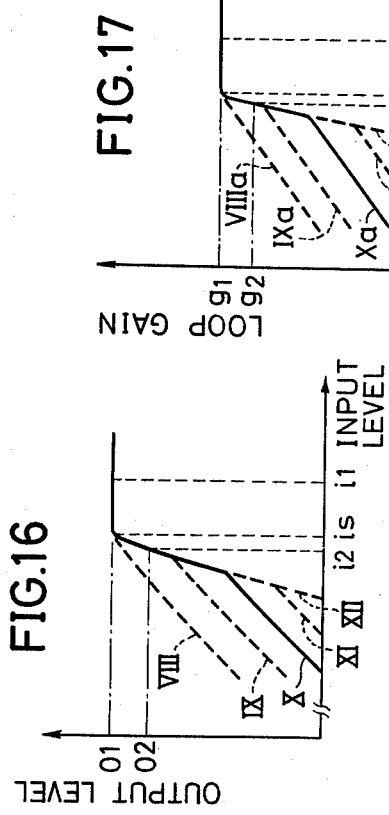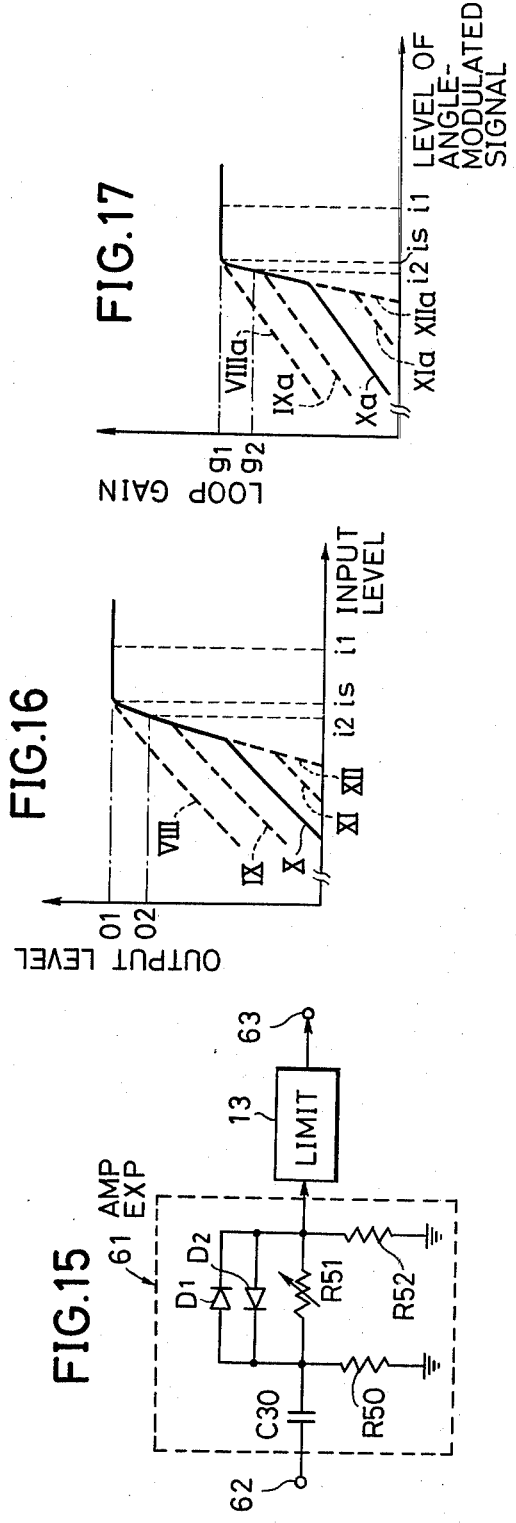

SYSTEM FOR DEMODULATING ANGLE-MODULATED SIGNALS

BACKGROUND OF THE INVENTION

This application is a continuation-in-part application of a copending U.S. Patent application Ser. No. 712,707 filed Aug. 9, 1976.

The present invention relates generally to systems for demodulating angle-modulated signals, and more particularly to a system using a tracking loop for demodulating angle-modulated signals, with a large signal to noise ratio.

A system which uses a phase locked loop (hereinafter referred to as "PLL") comprises a phase comparator, a loop filter, a DC amplifier, a voltage-controlled oscillator, and other components. Heretofore, such a system has provided demodulated angle-modulated wave signals.

In this PLL, if the loop has a wide band width, noise will readily impart an effect. However, there is no ready effect from noise if the loop has a narrow band width. The loop band width of a PLL, however, cannot be narrower than a certain degreee, since it depends upon factors such as the frequency band width of the angle-modulated wave signal and the modulation signal level. Consequently, if there is a high level of noise within or in the vicinity of the frequency band of the angle-modulated wave signal, the noise will impart an effect. In some cases, the phase locked loop may unlock. In such a case, the loop may lock with the noise component, and normal demodulation becomes impossible, whereby an abnormal noise generated Furthermore, as is known, the input signal frequency versus error signal voltage characteristic of a PLL has a linearly sloped characteristic. The error voltage increases as the frequency increases from a center frequency $fo$ and decreases as the frequency decreases from this center frequency $fo$. Thus, as the frequency is gradually elevated from the center frequency $fo$, the error voltage also increases (with positive polarity) in proportion thereto. However, when the frequency reaches a certain value $f1$, the error voltage instantaneously becomes zero. As the frequency is gradually lowered from the frequency $f1$ to a value $f2$ ($fo < f2 < f1$), the error voltage rises abruptly. The characteristic returns to the original sloped characteristic.

Similarly, when the frequency is gradually lowered from the center frequency $fo$, the error voltage also decreases (with negative polarity) in proportion thereto. When the frequency reaches a certain value $f4$, the error voltage instantaneously becomes zero. When the frequency is gradually raised from the value $f4$ to a value $f3$ ($f4 < f3 < fo$), the error voltage abruptly rises. The characteristic returns to the original sloped characteristic. In this connection, the frequency interval of from $f4$ to $f1$ is generally called the "lock range". The frequency range of from $f3$ to $f2$ is called the "capture range".

Accordingly, there is no problem whatsoever if the frequency deviation width $\Delta f$ of the PLL input angle-modulated wave signal falls between the frequencies $f4$ to $f1$, that is, within the lock range. However, if this frequency deviation width is greater than the lock range, the error voltage abruptly becomes zero when the angle-modulated carrier wave exceeds the lock range. Consequently, large abnormal noises are generated in the demodulation output at this time.

Furthermore, if an analog multiplier is used in the phase comparator of the PLL, the loop gain varies in accordance with the magnitude of the level of the angle-modulated wave signal fed as input into the phase comparator. Then, the lock range also varies.

When an interference arises as a consequence of the angle-modulated wave signal and a noise is introduced from the outside and existing within the band of this angle-modulated wave signal, the level of this signal sometimes drops abruptly or becomes zero. The lock range also drops each time this occurs. As a consequence, an unlocking of the PLL occurs frequently, even when the frequency deviation width $\Delta f$ of the angle-modulated wave signal is small. Abnormal noise and distortion are then generated in the demodulated output.

Discrete 4-channel system record discs, described by United States Pat. Nos. 3,686,471 and 3,883,699, have been reduced to practice. In a system of this character, two sum and difference signals are obtained by matrixing 4-channel signals. The difference signals are angle modulated. Direct-wave sum signals and angle-modulated wave difference signals are multiplexed and recorded in a single sound groove of the record disc. When this record disc is reproduced (played) by a reproducing stylus, a tracing distortion is produced because the extreme tip of the reproducing stylus has a certain finite radius, as is known. When this tracing distortion is present, the higher harmonic component of the direct-wave signal becomes admixed into the angle-modulated wave band. The PLL then lacks erroneously, in some cases, to this higher harmonic component of the direct-wave signal.

Thus, when a multichannel record disc is being reproduced and a conventional demodulation system having a PLL is used, various problems arise such as the generation of distortion and abnormal noise in the reproduced signal. These undesirable effects are due to causes such as: erroneous locking with respect to higher harmonic components of the direct-wave signal due to the above mentioned tracing distortion; a drop in the level of the angle-modulated wave signal due to interference imparted to the angle-modulated wave signal by the higher harmonic component; and a drop in the level of the reproduced angle-modulated wave signal due to causes such as a deterioration of the tracing ability of the reproducing stylus, and wear of the sound groove of the record disc.

SUMMARY OF THE INVENTION

Accordingly, a general object of the present invention is to provide a novel and useful system for demodulating angle-modulated wave signals, which overcomes the above described difficulties, heretofore accompanying a PLL.

Another and more specific object of the invention is to provide a system for demodulating an angle-modulated wave signal without generating noise, even if unlocking occurs in the PLL, and abnormal noise is generated.

Another object of the invention is to provide a system using a novel tracking loop for demodulating angle-modulated wave signals.

Another object of the invention is to provide a system for demodulating an angle-modulated signal so that a level of an output demodulated signal always remains constant.

A further object of the invention is to provide a system for demodulating an angle-modulated signal in a good state with detection of over modulation and carrier drops of the input angle-modulated signal.

A still further object of the invention is to provide a demodulating system having a great stability of a phase locked loop, and a demodulating frequency characteristic which is flat over a wide frequency range.

Other objects and further features of the invention will be apparent from the following detailed description with respect to preferred embodiments of the invention when read in conjunction with the accompanying drawings briefly described below.

BRIEF DESCRIPTION OF THE DRAWINGS

In the drawings:

FIG. 14 is a block diagram of a fifth embodiment of the demodulation system of the invention;

FIG. 15 is a circuit diagram showing an example of an amplitude expansion circuit shown in FIG. 14;

FIG. 16 is a graph indicating an input-output level characteristic of the circuit shown in FIG. 15;

FIG. 17 is a graph indicating a characteristic of a level of an angle-modulated signal versus a loop gain of the loop shown in FIG. 14;

DETAILED DESCRIPTION

Figure 1:
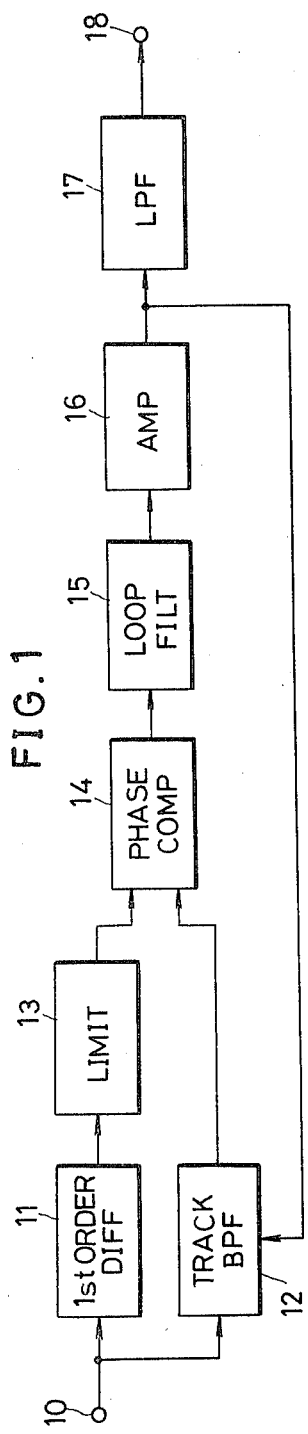
FIG. 1 is a block diagram of a first embodiment of the system for demodulating angle-modulated signals according to the present invention.

In a first embodiment of the invention (FIG. 1) an angle-modulated signal is introduced through an input terminal 10 and supplied respectively to a first-order differentiation circuit 11 and a tracking band-pass filter 12. The first-order differentiation circuit 11 exhibits a phase difference characteristic of 90° between input and output, within the frequency band of the angle-modulated wave signal. Accordingly, the output angle-modulated signal of the differentiation circuit 11 is phase shifted by 90° relative to the input angle-modulated signal. Furthermore, the noise component of the output angle-modulated signal, existing in a band lower than the angle-modulated signal band, is thoroughly suppressed by the differentiation circuit 11.

The noise component existing in a band higher than the angle-modulated signal band is, conversely, intensified by the differentiation characteristic. However, the level of the noise component in this high frequency band is very low, in actual practice. There is almost no deleterious effect due to this intensification. The above mentioned noise suppressing effect of the low band is far greater.

The output angle-modulated signal of the differentiation circuit 11 is subjected to waveform shaping in an amplitude limiting amplifier 13. This shaped output will not exceed a specific level and thereafter is supplied to a phase comparator 14. The signal which has passed through the tracking band-pass filter 12, operating in the manner described hereinafter, is also supplied to the phase comparator 14. The phase comparator 14 comprises an analog multiplier of phase detection limit ± $\pi/2$ rad. and produces an output error signal having a level in accordance with the phase difference of two signals.

The carrier component of the output error signal of the phase comparator 14 is removed by a loop filter 15. The resulting error signal is then supplied to an amplifier 16. The output signal of this amplifier 16 is sent to a low-pass filter 17. There the undesired carrier component is removed. The resulting signal is a demodulated signal appearing at the output terminal 18. The output signal of the amplifier 16 is supplied to the above mentioned tracking band-pass filter 12.

The center pass band frequency of the tracking band-pass filter 12 is variably controlled responsive to a signal from the amplifier 16. Therefore, at the time of tracking, the pass-band center frequency of the tracking band-pass filter 12 automatically follows the frequency of the angle-modulated signal.

Figure 2:
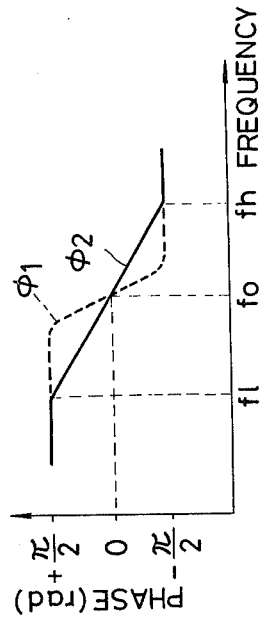
FIG. 2 is a circuit diagram showing one embodiment of a specific circuit of the tracking band-pass filter for use in the system illustrated in FIG. 1.

One embodiment of a circuit of the tracking band-pass filter 12 is illustrated in FIG. 2. An angle-modulated wave signal is introduced through the input terminal 10 and applied to an input terminal 21. A control signal from the amplifier 16 is applied to a terminal 28 which is connected to the gate of a field effect transistor (hereinafter referred to as an "FET") 24. The resistance R2 between the drain and source of the FET 24 is variably controlled responsive to the control signal applied to its gate. Here, the center frequency Fo of the pass band of the tracking band-pass filter 12 can be expressed by the following equation, which is expressed in terms of the resistances R1 and R3 respectively of the resistors 22 and 23 and the capacitances C1 and C2 respectively of the capacitors 25 and 26.

$$Fo = \frac{1}{2\pi}\sqrt{\frac{R1 + R2}{C1\,C2\,R1\,R2\,R3}} \tag{1}$$

Then, if R1 and R2 are selected so that R1>R2, the above Eq.(1) becomes:

$$Fo = \frac{1}{2\pi}\sqrt{\frac{1}{C1\,C2\,R2\,R3}} \tag{2}$$

Thus, as a consequence of the variation of the resistance R2 of the FET 24 in response to the control signal applied to the terminal 28, the center frequency Fo of the tracking band-pass filter 12 is variably controlled.

Figure 3:
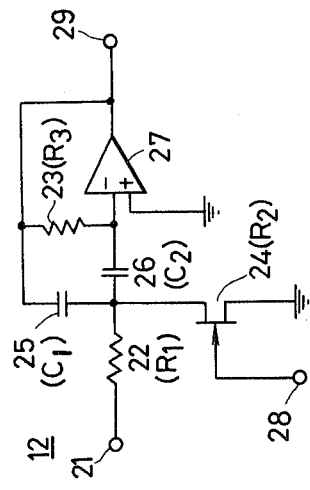
FIG. 3 is a graph indicating the filtering frequency band characteristic of the tracking band-pass filter.

As indicated in FIG. 3, showing the filtering band characteristic of the tracking band-pass filter 12, the center frequency Fo varies as indicated by full lines, and broken lines. The variation is within the range extending from a lower-limit cut-off frequency $fl$ to an upper-limit cut-off frequency $fh$. The carrier center frequency $fo$ of the input angle-modulated wave signal is the center frequency. Consequently, the complete tracking loop comprises the tracking band-pass filter 12, the phase comparator 14, the loop filter 15, and the amplifier 16. This tracking loop follows the input angle-modulated wave signal within the range indicated by the single-dot chain line in FIG. 3. The phase comparator 14 carries out a demodulation operation.

Figure 4:
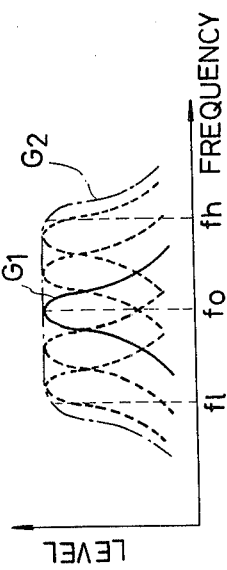
FIG. 4 is a graph indicating the frequency versus phase characteristic of the tracking band-pass filter.

At the time when the tracking band-pass filter 12 is not tracking, the phase characteristic is of a nature indicated by a curve $\phi1$ in FIG. 4. It becomes a straight line $\phi2$, when the filter 12 is tracking. That is, the characteristic $\phi2$ becomes linear between frequencies $fl$ and $fh$ (between phase $+\pi/2$ to $-\pi/2$). Therefore, distortion is not generated in the tracking loop. The angle-modulated wave signal of a frequency deviation from the frequency $fl$ to the frequency $fh$ is demodulated without distortion.

Furthermore, as is also apparent from FIG. 4, the deviation of the phase characteristic between the input and output of the tracking band-pass filter 12 is within $\pm 90°$ when the carrier center frequency $fo$ of the angle-modulated wave signal is set at 0° (or 180°). Accordingly, even when a phase comparator 14 of $\pm \pi/2$ rad. is used, the tracking loop follows the phase characteristic $\phi1$, also below the frequency $fl$ and above the frequency $fh$. Therefore, the frequency characteristic of the output error signal voltage of the phase comparator 14 becomes as indicated in FIG. 5.

Figure 5:
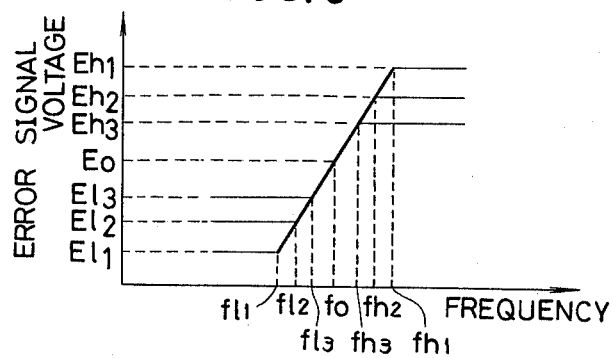
FIG. 5 is a graph indicating the frequency characteristic of an output error signal voltage of the phase comparator, for use in the system shown in FIG. 1.

As is apparent from FIG. 5, the PLL of the present invention differs from the conventional PLL. Even when the frequency deviation of the angle-modulated wave signal becomes lower than the frequency $fl$ or higher than the frequency $fh$, the output error signal voltage does not abruptly become zero. Therefore, abnormal noise is not generated such as is done in a PLL demodulation system. More specifically, band limiting is carried out automatically in accordance with the angle-modulated wave signal input level. The error signal voltage becomes saturated at $El2$ and $Eh2$ or $El3$ and $Eh3$ with the tracking range in a narrowed range such as that between the frequencies $fl2$ and $fh2$ or between the frequencies $fl3$ and $fh3$.

If the level of the input angle-modulated wave signal is normal, a characteristic is exhibited wherein the error signal voltage increases linearly between the frequencies $fl1$ and $fh1$, and becomes saturated below the frequency $fl1$ and above the frequency $fh1$. Therefore, even if there is a carrier drop wherein the angle-modulated wave signal momentarily disappears abnormal noise will not be generated.

Figure 6:
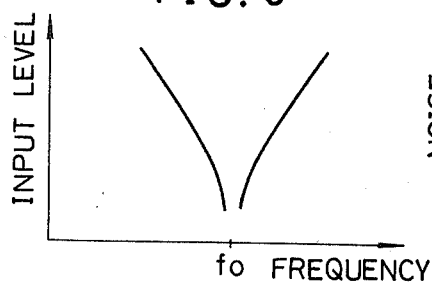
FIG. 6 is a graph indicating the tracking range frequency characteristic relative to input angle-modulated wave signal level.

The loop characteristic of the tracking loop varies in accordance with the level of the angle-modulated wave signal supplied by way of the tracking band-pass filter 12 to the phase comparator 14, and the tracking range also varies. The tracking range frequency characteristic with respect to the level of the input angle-modulated wave signal becomes as indicated in FIG. 6, which is similar to the lock range characteristic of a conventional PLL.

Figure 7:
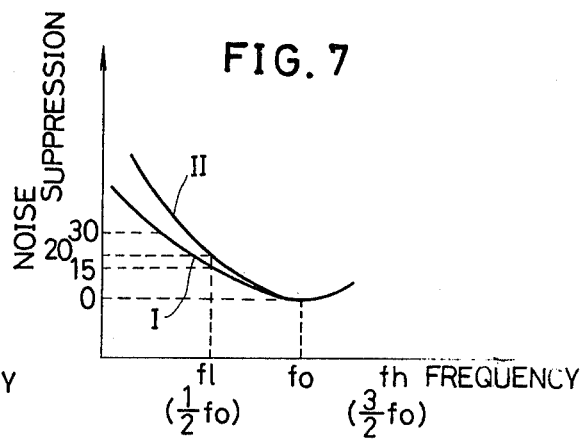
FIG. 7 is a graph indicating the frequency characteristic of a noise component suppression quantity.

FIG. 7 shows the frequency characteristic of noise suppression in the system according to the present invention. When frequencies $fl$ and $fh$ are expressed respectively as $fl = \frac{1}{2}fo$ and $fh = (3/2)\,fo$, noise is suppressed by a value in the order of 15 dB, at a frequency in the vicinity of $\frac{1}{2}fo$, as indicated by curve I in FIG. 7.

Figure 8:
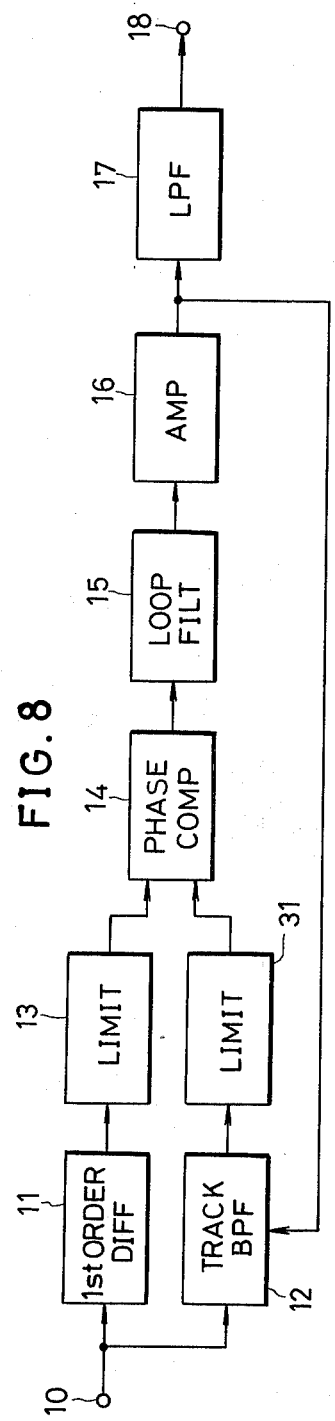
FIG. 8 is a block diagram of a second embodiment of the demodulation system of the invention.

A second embodiment of the invention will now be described with reference to FIG. 8. In FIG. 8, those parts which are the same as corresponding parts in FIG. 1 are designated by like reference numerals, and a detailed description of such parts will be omitted. In the instant embodiment of the invention, a second amplitude limiting amplifier 31 is provided between the tracking band-pass filter 12 and the phase comparator 14.

Figure 9:
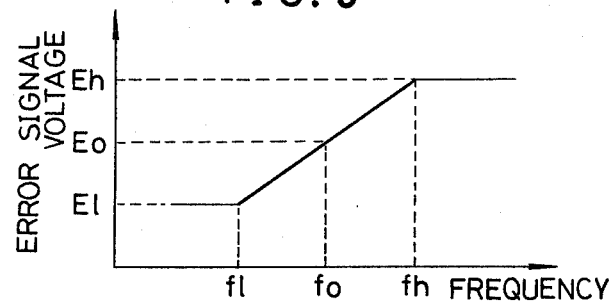
FIG. 9 is a graph indicating the frequency characteristic of an output error signal voltage of the phase comparator in the system illustrated in FIG. 8.

The output signal of the first-order differentiation circuit 11 is limited to a specific level by the first amplitude limiting amplifier 13 and then supplied to the phase comparator 14. The output signal of the tracking band-pass filter 12 is limited to a specific level by the second amplitude limiting amplifier 31 and then supplied to the phase comparator 14. Accordingly, in the instant embodiment, the error signal voltage characteristic does not vary as in the preceding embodiment of the invention, and becomes as indicated in FIG. 9.

In the block diagrams shown in FIGS. 1 and 8, the first-order differentiation circuit 11 may be substituted for an ordinary phase shifting circuit.

Figure 10:
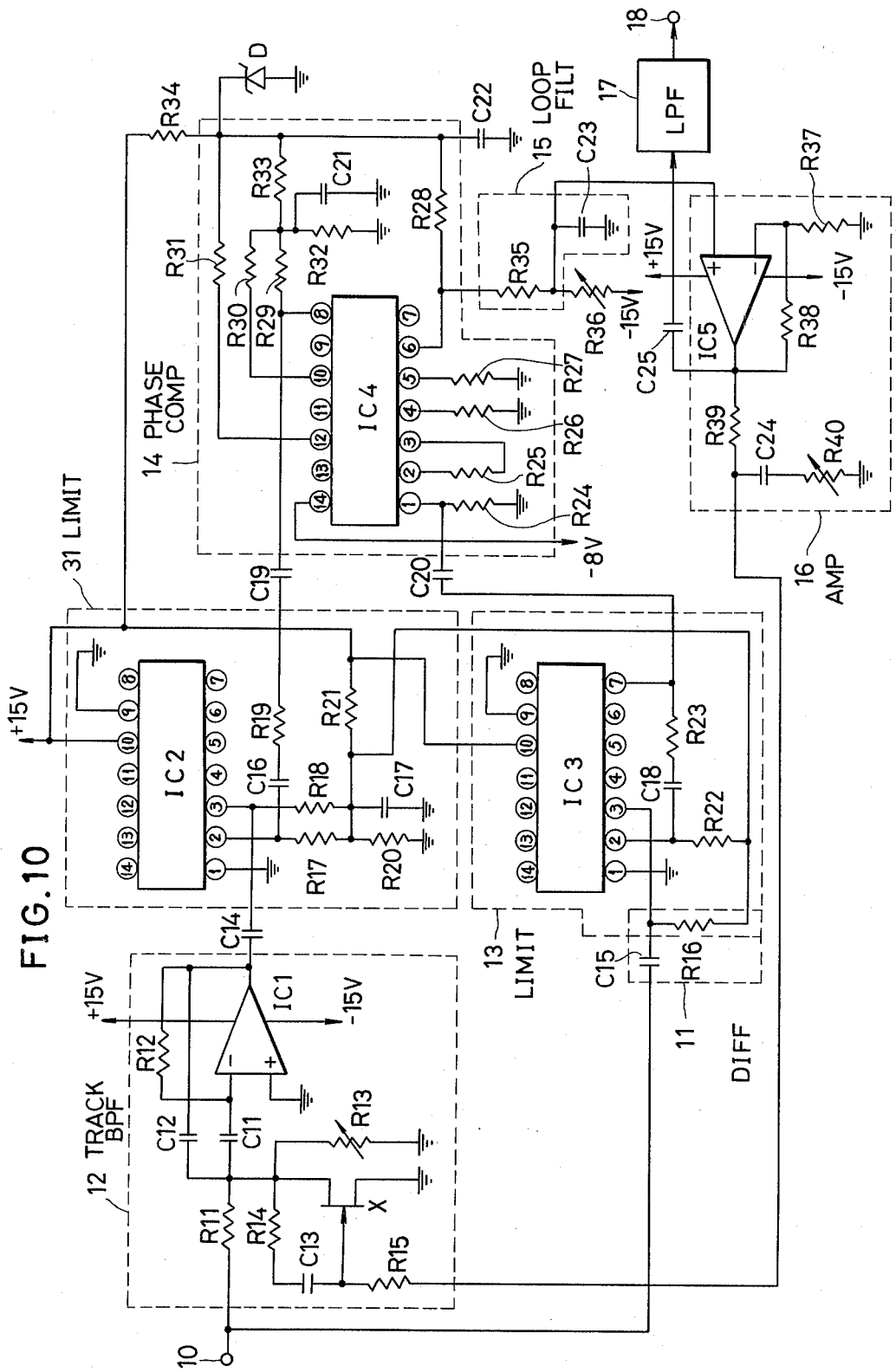
FIG. 10 is a circuit diagram showing one embodiment of a specific circuit for use in the system shown by the block diagram in FIG. 8.

FIG. 10 shows one specific embodiment of a demodulation system for use in the circuit of FIG. 8. In this FIG. 10 circuit, an angle-modulated wave signal is introduced through the input terminal 10 and supplied to the differentiation circuit 11 comprising a resistor R16 and a capacitor C15, and to the tracking band-pass filter 12 comprising resistors R11 through R15, capacitors C11, C12, and C13, a FET X, and an amplifier integrated circuit IC1.

When the internal resistance of the FET X is denoted by $r$, the center frequency Fo of the tracking band-pass filter 12 is represented as follows:

$$Fo = \frac{1}{2\pi} \sqrt{\frac{(r + R13)R11 + r \cdot R13}{C11 \cdot C12 \cdot R11 \cdot R12 \cdot R13 \cdot r}} \quad (3)$$

The resistances R14 and R15 and the capacitor C13, connected to the gate of the FET X, apply a level equal to one half the level of the angle-modulated wave signal which is generated between the drain and source of the FET X. This prevents a distortion of the angle-modulated wave signal passing through the tracking band-pass filter 12.

The cut-off frequency Fc of the differentiation circuit 11 is selected so that $Fc > 4Fo$. Furthermore, the phase difference between the input and output of the differentiation circuit 11 is set so that the angle-modulated wave signal will be substantially 90° relative to an unmodulated signal. The output signal of the differentiation circuit 11 passes through the amplitude limiting amplifier 13 comprising resistors R16, R22, and R23, a capacitor C18, and an integrated circuit IC 3 and is supplied by way of a coupling capacitor C20 to the phase comparator 14.

The output signal of the tracking band-pass filter 12 is supplied by way of a coupling capacitor C14 to the amplitude limiting amplifier 31 comprising resistors R17 through R21, capacitors 16 and 17, and an integrated circuit IC 2. The resulting output signal of the amplifier 31 is supplied by way of a coupling capacitor C19 to the phase comparator 14.

The phase comparator 14 comprises a multiplier integrated circuit IC 4 for detecting a product. The multiplier comprises resistors R24 through R33, and a capacitor C21. A resistor R34, a constant-voltage diode D, and a capacitor C22 constitute a decoupling circuit.

The output error signal of the phase comparator 14 passes through the loop filter 15 comprising a resistor R35 and a capacitor C23 and is supplied to the amplifier 16 comprising resistors R37 through R40, a capacitor C24, and an integrated circuit IC5 constituting an amplifier. The resistors R39 and R40 and the capacitor C24 in the amplifier 16 set an AC loop gain in order to obtain the necessary tracking frequency band.

The output error signal of the amplifier 16 is applied to the gate of the FET X of the tracking band-pass filter 12. Furthermore, this output error signal of the amplifier 16 is also a demodulated signal. For this reason, the demodulated signal passes through a coupling capacitor C25 and the low-pass filter 17 which removes the undesired carrier component. The demodulated signal is led out the output terminal 18. A variable resistor R36 sets the center frequency of the filtering band of the tracking band-pass filter 12.

In the instant embodiment, integrated circuits IC 3 and IC2 are used in the amplitude limiting amplifiers. However each of these amplitude limiting amplifiers may also comprise a combination of transistors, diodes, and resistors, or some other like combination.

Figure 11:
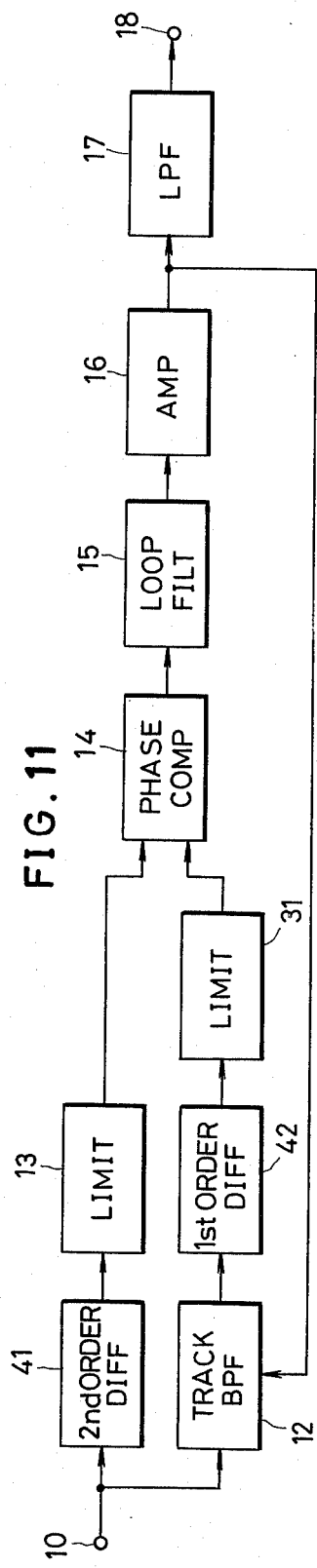
FIG. 11 is a block diagram of a third embodiment of the demodulation system of the invention.

A third embodiment of the invention will now be described with reference to FIG. 11. In FIG. 11, those parts which are the same as corresponding parts in FIGS. 1 and 8 are designated by like reference numerals. Therefore, the description of such parts will be omitted at this point in the specification.

In this demodulation system of the third embodiment of the invention, an angle-modulated wave signal is introduced through the input terminal 10 and supplied to a second-order differentiation circuit 41 and the tracking band-pass filter 12. The second-order differentiation circuit 41 exhibits a phase difference characteristic of 180° between the input and output thereof, with respect to the angle-modulated signal frequency band. The differentiation circuit 41 gives the angle-modulated wave signal a phase difference of 180° relative to the input. The noise component, particularly in the low-frequency range, is greatly reduced as it passes through the amplitude limiting amplifier 13. Then, it is supplied to the phase comparator 14.

The output signal of the tracking band-pass filter 12 is supplied to a first-order differentiation circuit 42, which produces a phase difference of 90° relative to the input signal. The noise component in the low-frequency signal range is reduced. The resulting output signal of the differentiation circuit 42 passes through the amplitude limiting amplifier 31 and is supplied to the phase comparator 14. There is a 90° phase difference between the signals supplied from the amplitude limiting amplifiers 13 and 31 to the phase comparator 14.

The other features of this third embodiment of the demodulation system are the same as those of the preceding embodiments, and therefore description thereof will be omitted.

In accordance with the third embodiment, the noise suppression quantity is as indicated by a curve II in FIG. 7. The noise at the frequency $f1$ ( = $\frac{1}{2}fo$) is suppressed by approximately 20 dB.

Figure 12:
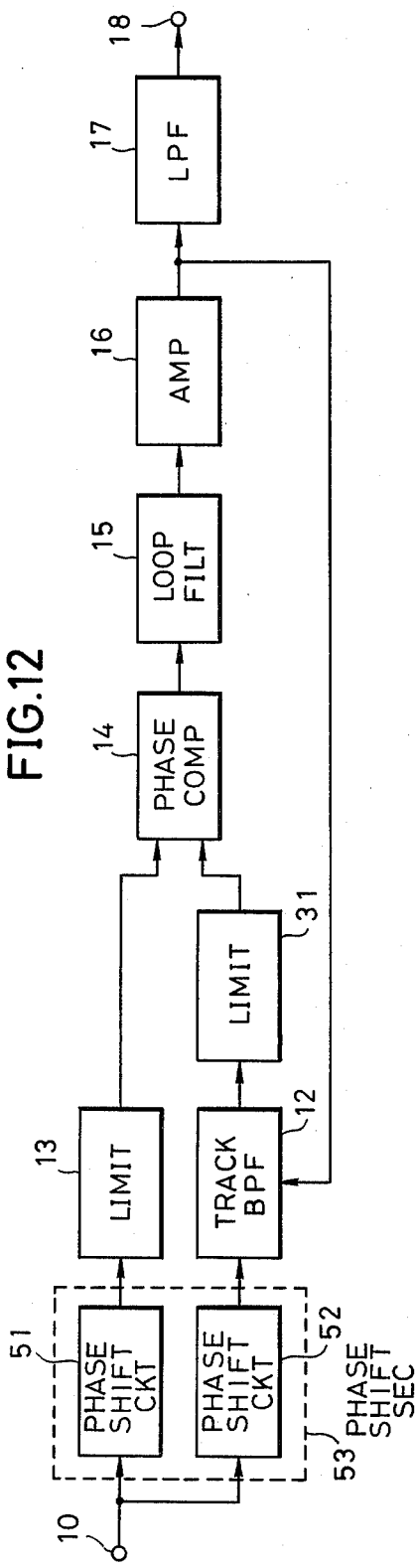
FIG. 12 is a block diagram of a fourth embodiment of the demodulation system of the invention.

A fourth embodiment of the demodulating system will now be described with reference to FIG. 12. In FIG. 12, those parts which are the same as corresponding parts in FIGS. 1 and 8 are designated by like reference numerals. Therefore, a description of such parts will be omitted from this point in the specification.

Figure 13A:
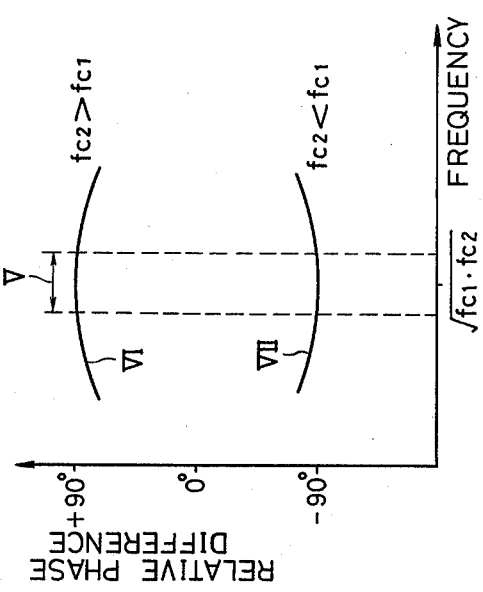
FIGS. 13A and 13B are respectively graphs for explaining the operation of a phase shifting circuit shown in FIG. 12.

An angle-modulated wave signal is introduced through the input terminal 10 and supplied to phase shifting circuits 51 and 52 of a phase shifting section 53. The primary purpose for the phase shifting circuits 51 and 52 is to transfer the signal and to produce output signals having a relative phase difference of 90°. The phase shifting circuit 51 has a phase lag characteristic as indicated by curve III in FIG. 13A, for example. There is a −90° phase shift characteristic between the input and output of circuit 51, at the time of an input frequency $fc1$. The phase shifting circuit 52 has a phase-lag characteristic as indicated by curve IV, wherein there is a -90° phase shift characteristic between the input and output, with an input frequency $fc2$. The time constants of the phase shifting circuits 51 and 52 are selected so that the geometric mean $\sqrt{fc1 \cdot fc2}$ of the frequencies $fc1$ and $fc2$ coincides with the center frequency of the input angle-modulated wave.

Figure 13B:
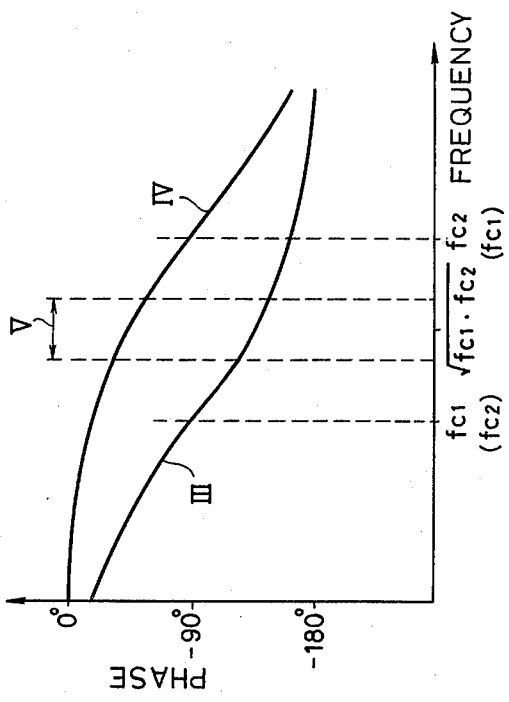

When the frequency $fc2$ is higher than the frequency $fc1$, the relative phase characteristic between the outputs of the phase shifting circuits 51 and 52, becomes a constant phase difference of substantially +90° within an angle-modulated wave signal frequency band V, as indicated by curve VI in FIG. 13B. When the relative magnitudes of the relationships between the frequencies $fc1$ and $fc2$ are reversed, and $fc2$ is lower than $fc1$, the relative phase characteristic between the outputs of these phase shifting circuits 51 and 52 becomes a constant phase difference of substantially −90° within the band V, as indicated by curve VII in FIG. 13B. Accordingly, by appropriately selecting the relationship of the magnitudes of these frequencies $fc1$ and $fc2$, the relative phase difference can be either −90° or +90°.

The output of the phase shifting circuit 51 is supplied to the amplitude limiting amplifier 13. The output of the phase shifting circuit 52 is supplied to the tracking band-pass filter 12. The organization and operation of the other components in block diagram are the same as described in connection with the preceding embodiments of the invention and, therefore, will not be described again.

A fifth embodiment of the demodulating system of the invention is shown in FIG. 14. In FIG. 14, those parts which are the same as corresponding parts in FIG. 11 are designated by like reference numerals. Therefore, the description of such parts will not be repeated.

In each of the above described embodiments of the invention, if a high level of noise is admixed within the frequency band of the input angle-modulated wave signal, and is of the same frequency as the angle-modulated wave signal, and if the noise and the angle-modulated wave signal are of opposite phase, the noise signal sometimes causes the level of the angle-modulated signal to drop or disappear instantaneously, Furthermore, instances also occur wherein the noise signal causes a disturbance in the tracking loop, and the loop follows up the noise signal. In such a case, distortion and abnormal noise are generated in the demodulated signal. The fifth embodiment of the invention illustrated in FIG. 14 solves this problem.

The block arrangement of this fifth embodiment differs from that of the third embodiment of the invention illustrated in FIG. 11. In the fifth embodiment, an amplitude expansion circuit 61 is interposed between the second-order differentiation circuit 41 and the amplitude limiting amplifier 13. This amplitude expansion circuit 61 is , for example, similar to that shown in FIG. 15. This circuit 61 is supplied through an input terminal 62 with the output signal of the second-order differentiation circuit 41. The amplitude expansion circuit 61 comprises a capacitor C30, resistors R50 and R52, a variable resistor R51, and diodes D1 and D2 connected as shown in FIG. 15. The variable resistor R51 is used to vary and set the amplitude expansion of the amplitude expansion circuit 61. If the input angle-modulated signal supplied through the input terminal 62 to the amplitude expansion circuit 61 is at a high level, as indicated by $i_1$ above a specific level $i_s$ in FIG. 16, the amplitude of an output signal appearing at terminal 63 is limited at a constant level $o_1$ by the amplitude limiting amplifier 13. The input angle-modulated signal supplied to the amplitude expansion circuit 61 is not limited if it is a level (such as $i_2$) which is lower than the specific lever $i_s$ (FIG. 16). It is not limited by the limiting amplifier 13 even when it is amplitude expanded by the amplitude expansion circuit 61, and an output of a level as indicated by $o_2$ is led out through the output terminal 63.

By varying the variable resistor 51, the amplitude expansion characteristic is set as indicated by curves VIII through XII in FIG. 16. For example, when the resistance R51 is zero, the opposite terminals of the diodes D1 and D2 are short-circuited. For this reason, the amplitude expansion circuit 61 does not carry out amplitude expansion operation, and the resulting amplitude expansion characteristic is indicated at VIII in FIG. 16. As the resistance of the variable resistor R51 increases, the amplitude expansion characteristic increases, as indicated at IX, X, and XI in FIG. 16. If the resistance R51 is infinite, the characteristic is indicated at XII when the level of the input angle-modulated signal decreases below the conductive levels of the diodes D1 and D2, the signal is no longer transmitted to the output terminals 63.

The angle-modulated wave signal appearing at the output terminal 63 is supplied to the phase comparator 14. When the level of this angle-modulated signal varies, the output error signal level of the phase comparator also varies. Consequently, when the level of the angle-modulated signal increases, the level of the output error signal increases, and the loop gain of the closed tracking loop increases. Conversely, when the level of the angle-modulated signal decreases, the loop gain decreases.

Consequently, the amplitude expansion circuit 61 and the amplitude limiting amplifier 13 produce an input angle-modulated signal level versus loop gain characteristic as indicated in FIG. 17. When the input angle-modulated signal level is $i_1$, the loop gain is indicated by level $g_1$. When the input angle-modulated signal level is lower than $i_1$, as at $i_2$, for example, the loop gain is less than the loop gain $g_1$ as indicated at $g_2$. Moreover, there is a much lower loop gain in comparison with the gain when there is no amplitude expansion.

When the input angle-modulated signal level is reduced below a specific level by appropriately setting the variable resistor R51, the loop gain drops as indicated by curves VIIIa, IXa, Xa, XIa, and XIIa in FIG. 17. That is, the variation characteristic of the loop gain is set at will by means of the variable resistor R51. In this connection, in FIG. 17, the curve VIIIa indicates the loop gain characteristic when the amplitude expansion is not carried out (i.e., the resistance value of the variable resistor 51 is zero). The curve XIIa indicates the loop gain characteristic of a maximum amplitude expansion (i.e., the resistance value of the variable resistor is infinity).

Figure 18:
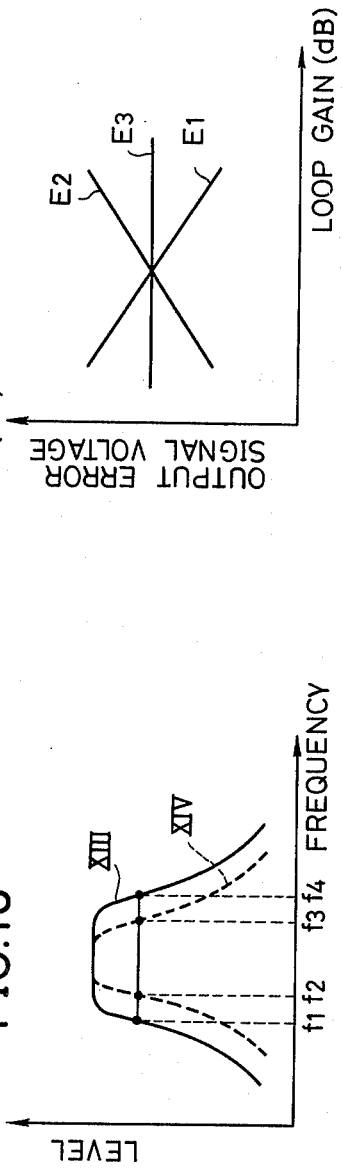
FIG. 18 is a graph indicating the pass hand characteristic of a tracking band-pass filter shown in FIG. 14.

FIG. 18 indicates the passing band characteristics of the tracking band-pass filter 12.

At the time of tracking, the passing band width of the band-pass filter 12 becomes wide as indicated between frequencies $f1$ and $f4$ on the solid-line curve XIII, when the loop gain increases. When the loop gain decreases, this passing band width becomes narrow as indicated between frequencies $f2$ and $f3$, on the broken-line curve XIV.

Accordingly, when the level of the input angle-modulated signal is higher than a specific level, the input signal level of the phase comparator 14 is constant, and is limited by the amplitude limiting amplifiers 13 and 31. For this reason, the loop gain is constant, and the passing band width of the tracking band-pass filter 12 is the maximum and is constant.

When a noise component (disturbance wave) which has become admixed in the frequency band of the input angle-modulated signal and a noise component (disturbance wave) residing in the vicinity of the lower side band interfere with the angle-modulated signal, the angle-modulated signal level drops instant by instant. In accordance with the present invention, the level of the angle-modulated signal supplied to the phase comparator 14 is further reduced by the operation of the amplitude expansion circuit 61. As a consequence, the loop gain drops abruptly. The frequency band of the tracking band-pass filter 12 becomes narrow, as indicated by a broken line in FIG. 18.

For this reason, when the angle-modulated signal interferes with the noise components, interference distortion, abnormal noise, and the like are suppressed in the demodulated output signal. Therefore, a demodulated output signal can be obtained with a large signal-to-noise ratio.

Figure 19:
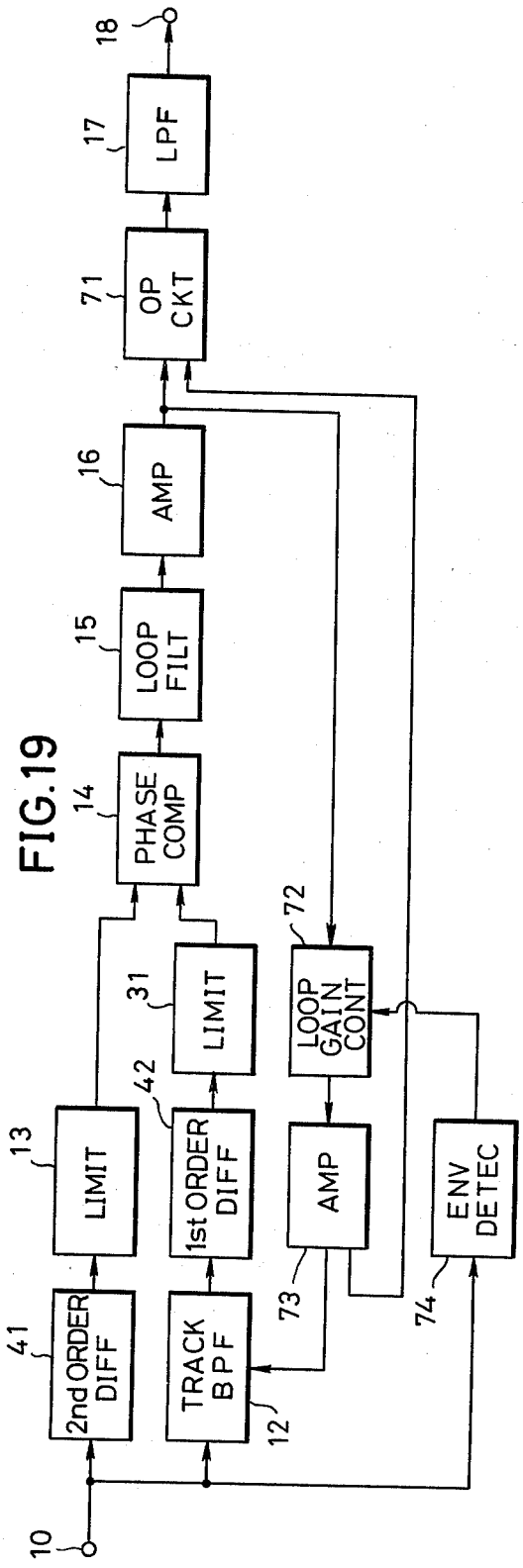
FIG. 19 is a block diagram of a sixth embodiment of the demodulation system of the invention.

A sixth embodiment of the demodulated system of the invention is illustrated in FIG. 19. In FIG. 19, those parts which are the same as corresponding parts in FIG. 11 are designated by like reference numerals. The description of such parts will not be repeated.

The output signal of an amplifier equivalent to amplifier 16 is, supplied to an operation circuit 71 and to a loop gain control circuit 72. An input angle-modulated signal entering through the input terminal 10 is supplied to the second-order differentiation circuit 41 and the tracking band-pass filter 12. In addition, this input signal is supplied to an envelope detection circuit 74. The resulting output of this envelope detection circuit 74 is a signal for controlling the loop gain of control circuit 72.

The resulting output of the loop gain control circuit 72 is amplified at 73 and supplied as a control signal to vary and control the center frequency of the tracking band-pass filter 12. In addition, the output of the amplifier 73 is supplied as an error signal voltage for the operation circuit 71. This error signal voltage increases and decreases in response to the output signal of the envelope detection circuit 74, that is, in proportion to the variation amount of the input angle-modulated signal.

Figure 20:
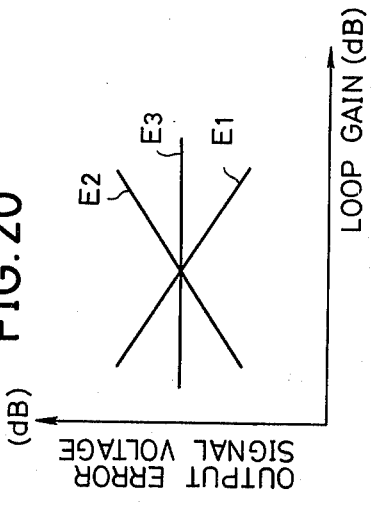
FIG. 20 is a graph indicating a characteristic of a loop gain versus an output error signal voltage.

The output error signal voltage of the amplifier 16 and the output error signal voltage of the amplifier 73 have loop gain versus output error signal voltage characteristics, respectively, as indicated by lines $E_1$ and $E_2$ in FIG. 20. Accordingly, as a result of the operation of circuit 71 on the two output error signal voltages $E_1$ and $E_2$, the operation circuit 71 produces a constant error signal voltage $E_3$ irrespective of variations of the loop gain of the tracking loop. The unwanted carrier component is removed from this output of the circuit 71 by the low-pass filter 17. A constant level demodulated signal appears at the output terminal 18.

Figure 21:
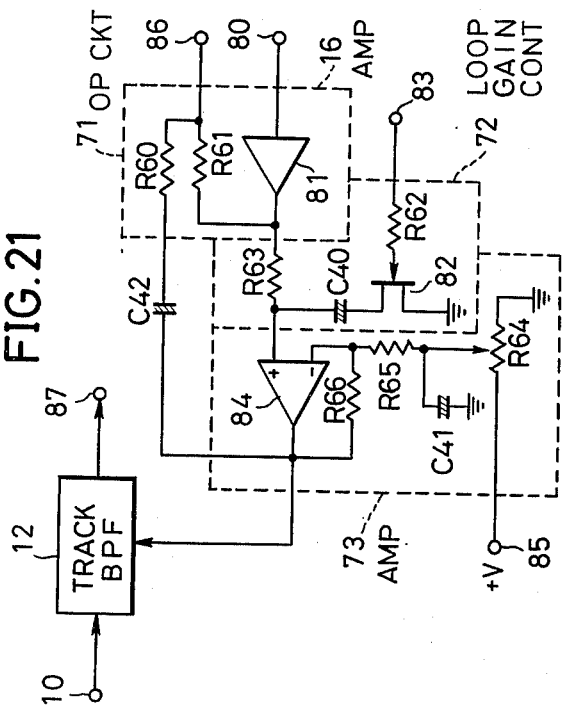
FIG. 21 is a circuit diagram showing an example of an essential part of the block system shown in FIG. 19.

FIG. 21 shows one example of a specific circuit for use in the system of FIG. 19. The output signal of the loop filter 15, applied to a terminal 80, is supplied to the amplifier 16 comprising an amplifier 81. The output of amplifier 81 is supplied to the loop gain control circuit 72 comprising resistors R62 and R63, a capacitor C40, and a FET 82. The output control signal of the envelope detection circuit 74 is applied by way of a terminal 83 and the resistor R62 to the gate of the FET 82. Responsive to this control signal, the resistance between the drain and source of the FET 82 is controllably varied. The output terminal of the amplifier 81 is connected through the resistor R63 to the non-inverting input terminal of an amplifier 84 in the amplifier 73.

When the level of the input angle-modulated signal decreases, the resistance between the drain and source of the FET 82 decreases. The level of the signal supplied to the amplifier 84 is reduced. Consequently, the output signal level of the amplifier 84 is also reduced. The amplifier 73 comprises the amplifier 84, resistors R65 and R66, a capacitor C41, and a variable resistor R64 connected to a positive DC power-source terminal 85.

The output of the amplifier 84 is supplied to the tracking band-pass filter 12 and through a capacitor C42 to the operation circuit 71. The operation circuit 71 adds the output of amplifier 81 (passed through a resistor R61) and the output of amplifier 84 (passed through a resistor R60). The resulting signal, at output terminal 86 is supplied to the low-pass filter 17. The resistances R60 and R61 are selected so that the level of the signal at the output terminal 86 is substantially constant, at the time of tracking.

Figure 22:
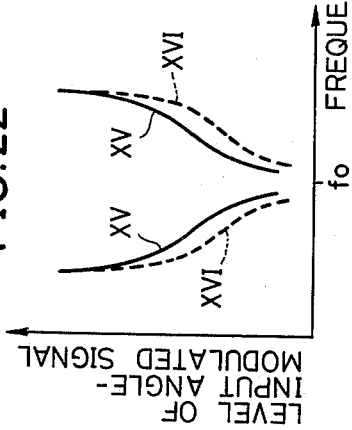
FIG. 22 is a graph indicating a characteristic of tracking range.

The output signal of the amplifier 84 is supplied to the tracking band-pass filter 12. For example, when the level of the input angle-modulated signal decreases, the level of the output signal of the amplifier 84 also decreases. For this reason, the control range of the center frequency of the tracking band-pass filter 12 decreases. In this manner, the tracking range is controlled in response to the level of the input angle-modulated signal. This tracking range characteristic is indicated by curves XV and XVI in FIG. 22. The curves XV and XVI are varied by setting the threshold level of the control signal applied to the gate of the FET 82 of the loop gain control circuit 72. The output of the tracking band-pass filter 12 is led out through a terminal 87 and supplied to the first-order differentiation circuit 42.

When band-pass filter 12 is tracking, the tracking loop is in a negative feedback operation. For this reason, a constant relationship is maintained within the tracking loop even when a level function is caused by the loop gain control circuit 72. More specifically, when the output error signal voltage $E_2$ of the amplifier 73 increases, the input voltage $E_1$ of the loop gain control circuit 72 is reduced. The error signal voltages $E_1$ and $E_2$ are respectively inversely proportional with respect to the loop gain, as indicated in FIG. 20. Consequently, as described above, an output signal of a constant voltage $E_3$ is obtained from the operation circuit 71.

Figure 23:
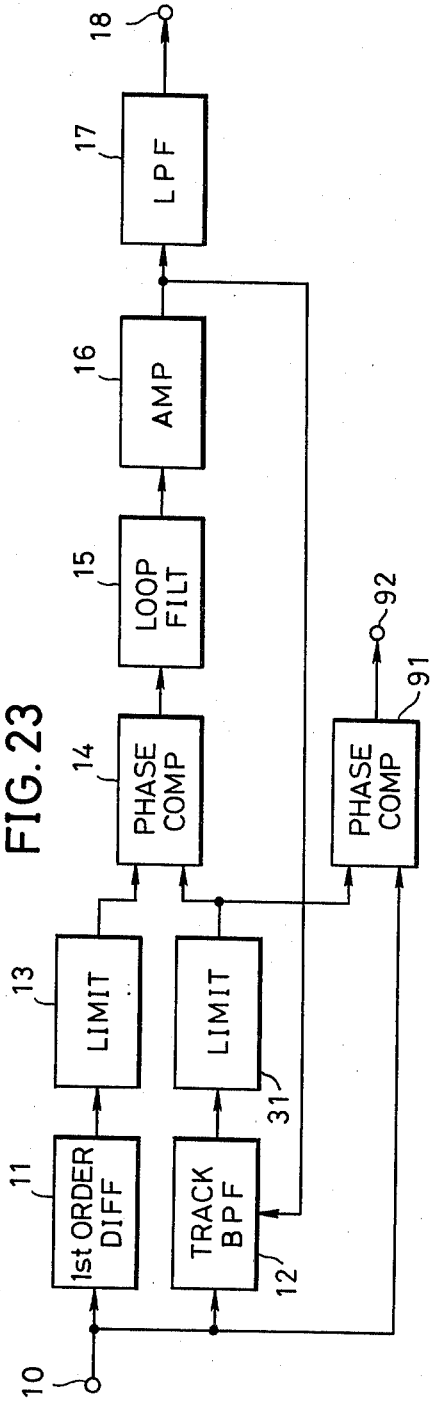
FIG. 23 is a block diagram of a seventh embodiment of the demodulation system of the invention.

A seventh embodiment of the demodulation system of the invention is illustrated in FIG. 23. In FIG. 23, those parts which are the same as corresponding parts in FIG. 8 are designated by like reference numerals. These parts will not be described again.

the angle-modulated signal introduced through the input terminal 10 is supplied to the first-order differentiation circuit 11 and the tracking band-pass filter 12, as well as to a phase comparator 91. The output signal of the amplitude limiting amplifier 31 is also supplied to the phase comparator 91. An output signal having a level which is responsive to the resulting phase difference is led out through an output terminal 92.

Figure 24A:
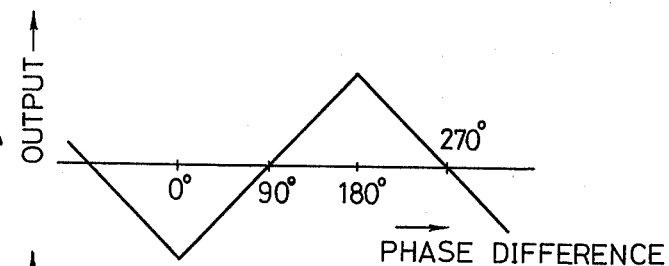
FIGS. 24A and 24B are graphs respectively indicating the characteristics of output voltage versus the phase difference of input signal of respective phase comparators shown in FIG. 23.
Figure 24B:
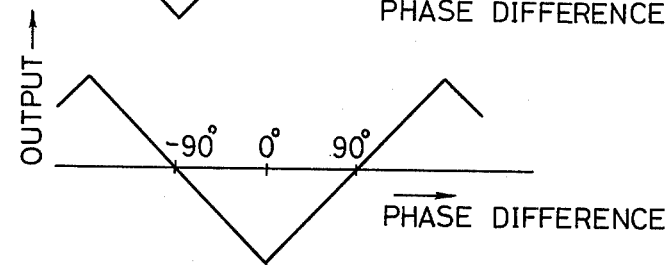

For the phase comparator 14, an analog multiplier of $\pm \pi/2$ rad is used. Its characteristic output voltage with respect to the input signal phase difference, is as indicated in FIG. 24A. On the other hand, the output voltage characteristic, with respect to input signal phase difference of the phase comparator 91, is as indicated in FIG. 24B. The phase differs by 90° relative to the phase of the comparator 14, as indicated in FIG. 24A. Accordingly, from the phase comparator 91, the output voltage has the same polarity as the input angle-modulated signal, irrespective of the deviation frequency.

Figure 25:
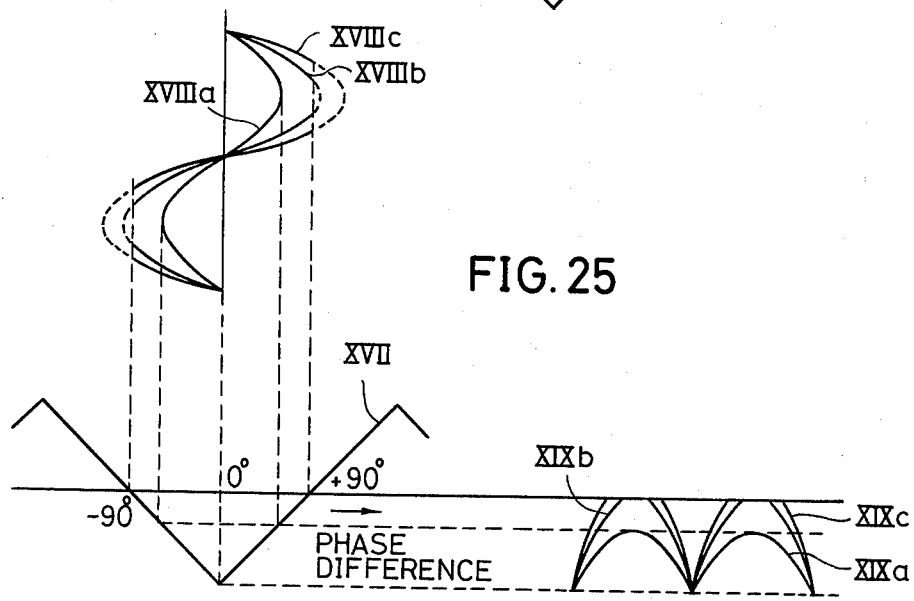
FIG. 25 is a graph indicating a relation between input angle-modulated signals having respectively different modulation degrees and output signals in the phase comparator.

The relation of the output signal to the input angle-modulated signal of the phase comparator 91 is indicated in FIG. 25. Outputs having waveforms resembling full-wave rectified waves (curves XIXa, XIXb, and XIXc) are obtained if angle modulated signals have a constant input level and different degrees of modulation, as indicated by curves XVIIIa, XVIIIb, and XVIIIc in FIG. 25. These signals are introduced as an input to the phase comparator 91 having the characteristic indicated by the curve XVII (which is the same as the characteristic indicated in FIG. 24B. More specifically, overmodulated input, angle-modulated signals exceed $\pm\pi/2$ rad ($\pm 90°$) as indicated by curves XVIIIb and XVIIIc. The corresponding output signal waveforms assume amplitude limited forms at a certain level, as indicated by curves XIXb and XIXc. With respect to an input, angle-modulated signal which is not overmodulated as indicated by curve XVIIIa, a corresponding output is obtained with a normal waveform as indicated by curve XIXa.

Accordingly, the output of the phase comparator 91 is detected to distinguish whether the output is of the waveform XIXa or is of the waveform XIXb or XIXc. It is possible to detect whether or not the input angle-modulated signal is overmodulated.

Figure 26:
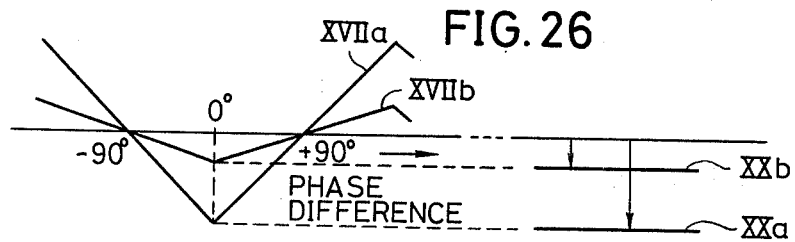
FIG. 26 is a graph indicating a relation between input angle-modulated signals having respectively different carrier levels and output signals in the phase comparator.

Furthermore, the phase comparator 91 can detect both the overmodulation of the input angle-modulation signal and a drop in the carrier level. More specifically, an analog multiplier is used for the phase comparator 91 in the instant embodiment of the invention. The characteristic of the phase comparator 91 varies in response to the level of the input angle-modulated signal, as indicated by curves XVIIa and XVIIb in FIG. 26. Therefore, when the degree of modulation of the input angle-modulated signal is constant, and its carrier level is high, the characteristic of the phase comparator 91 is indicated by curve XVIIa. Its output is indicated by line XXa. When the carrier level is low, the characteristic of the phase comparator 91 is indicated by the curve XVIIb. Its output is indicated by line XXb.

The output detection signal led out through the output terminal 92 is used, for example, for controlling the loop gain of the demodulation circuit, depending on the level of the output detection signal. It is then possible to control the demodulation band and to greatly improve the sensation to the ear, with respect to abnormal phenomena of the input angle-modulated signal. Furthermore, if muting is to be applied depending on the existence or absence of the input angle-modulated signal, it is also possible to use the output at the terminal 92 as the muting control signal.

In each of the above described embodiments of the invention, an integration circuit is used for the loop filter 15, if the unwanted carrier component and the higher harmonic component cannot be fully removed by the loop filter 15.

As one example, a 90°-phase shifter (Hirbert filter), having flat frequency characteristic over the entire frequency band, is used in place of the first-order differentiation circuit 11 in FIG. 8. By denoting the carrier center angular frequency $\omega_c$ and the modulation signal $\mu(t)$, the input angle-modulated signal F1(t) can be expressed by the following equation:

$$F1(t) = e^{j\{\omega_c t + \int \mu(t)dt\}} \quad (4)$$

If it is assumed that the modulation signal $\mu(t)$ is of a small amplitude, and the center frequency of the tracking band-pass filter 12 is fixed, the output signal F2(t) of the filter 12 becomes:

$$F2(t) = a(t)e^{j\{\omega_c t + \sim\mu(t-\tau)dt\}}$$

$$\approx a(t)e^{j\{\omega_c t + \sim\mu(t)dt - \tau\mu(t)\}} \quad (5)$$

This indicates that the amplitude fluctuation $a(t)$ and the delay of the group delay time $\tau$ are being received by the filter 12. In this case, the band width of the filter 12 is narrow. For this reason, the group delay characteristic is not flat for the entire frequency band. Therefore, if one portion of the output error signal $e_o(t)$ is fed back, and the center frequency of the pass band of the tracking band-pass filter 12 is varied by a control signal f(t) from the loop filter 15, the output signal F2(t) will become:

$$F2(t) = a'(t)e^{j\{\omega_c t + \sim\mu(t-\tau)dt - f(t)\}}$$

$$a'(t)e^{j\{\omega_c t + \sim\mu(t)dt - \tau'\mu(t) - f(t)\}} \quad (6)$$

That is, due to the control signal f(t), the input angle-modulated signal is subjected to phase modulation in addition to the amplitude fluctuation component $a'(t)$.

This signal F2(t) is supplied to the amplitude limiting amplifier 31, by which the above mentioned amplitude flucutation component $a'(t)$ is removed. The resulting signal F3(t) is supplied to the phase comparator 14. Here, F3(t) becomes:

$$F3(t) = e^{j\{\omega_c t + \sim\mu(t)dt - \tau'\mu(t) - f(t)\}} \quad (7)$$

On the other hand, the output signal F4(t) of the Hirbert filter 11 undergoes a 90° phase shift and becomes:

$$F4(t) = je^{j\{\omega_c t + \sim\mu(t)dt\}} \quad (8)$$

This output signal F4(t) is applied through amplitude limiting amplifier 13 to the phase comparator 14. This phase comparator 4 uses an analog multiplier having an average zero level output when the phase difference of the two input signals F3(t) and F4(t) is 90°. For this reason, the output error signal $e_o(t)$ of the phase comparator 14 can be expressed as follows from Eqs. (7) and (8).

$$e_o(t) = -\sin\{\tau'\mu(t) + f(t)\}$$

$$\approx -\{\tau'\mu(t) + f(t)\} \quad (9)$$

This error signal $e_o(t)$ is supplied to the loop filter 15, where the unwanted carrier component and higher harmonics thereof are removed from the signal $e_o(t)$. The resulting signal is applied as a control signal f(t) to the tracking band-pass filter 12 and is also led out as a demodulated signal through the output terminal 18.

If a low-pass filter (single integral circuit) of a primary transfer function expressed by $F(s) = A/(s + \alpha)$ is used for the loop filter 15, the equation after Laplace transformation of the control signal f(t) becomes:

$$f(s) = F(s) \cdot e_o(s)$$

$$= \frac{-A}{s + \alpha}\{\tau'\mu(s) + f(s)\}$$

Accordingly, the demodulated output is:

$$f(s) = \frac{-A\tau'}{s + (\alpha + A)}\mu(s) \quad (10)$$

That is, this tracking loop is expressed by a first order total transfer function if a single integral circuit is used for the loop filter 15. Therefore, while a peak does not occur in the demodulated output, the cut-off characteristic is gentle.

However, for the demodulation frequency characteristic to the flat up to high frequencies, it is necessary for the cut-off frequency of the single integral circuit to occur at a high value. If this characteristic is flat up to a specific frequency required for by the demodulation system, the carrier component and the higher harmonic component thereof cannot be reduced sufficiently for stability of the tracking loop.

Accordingly, if a double integral circuit is used for the loop filter 15, the demodulation frequency characteristic can be made flat up to a specific frequency. The carrier component and its higher harmonic component can be reduced to a level necessary for the stability of the loop.

More specifically, when the transfer function $A(s)$ of the double integral circuit is expressed by the equation $$A(s) = \frac{A}{s^2 + \alpha s + \beta} \tag{11}$$

the equation resulting from a Laplace transformation of the output control signal $f(t)$ of the double integral circuit becomes, from Eqs. (9) and (11):

$$f(s) = A(s) \cdot e_o(s) \tag{12}$$

$$= \frac{-A}{s^2 + \alpha s + \beta} \{\tau'\mu(s) + f(s)\}$$

Therefore, $$f(s) = \frac{-A\tau'\mu(s)}{s^2 + \alpha s + (\beta + A)} \tag{13}$$

This is a secondary equivalent transfer function. Accordingly, while it is necessary to consider the problem of damping, it is possible to reduce the carrier component and its higher harmonic component as necessary for stabilization of the loop even when the demodulation frequency characteristic is set at the maximum flat characteristic. The cut-off frequency of the double integral circuit (low-pass filter) is made relatively high.

Further, this invention is not limited to these embodiments but variations and modifications may be made without departing from the scope and spirit of the invention.

What is claimed is:

1. A system for demodulating angle-modulated wave signals comprising:
    a first phase shifting circuit supplied with an angle-modulated signal;
    first amplitude limiting means for limiting the amplitude of an output signal of said first phase shifting circuit;
    a second phase shifting circuit supplied with the angle-modulated signal, said first and second phase shifting circuits producing outputs having a relative phase differece of 90°;
    tracking band-pass filtering means responsive to the output signal of the second phase shifting circuit and having a pass band with a center frequency which is controlled by a control signal;
    second amplitude means for limiting the amplitude of the output signal of said tracking band-pass filtering means;
    phase comparing means responsive to the output signals of said first and second amplitude limiting means for producing an error signal in accordance with the phase difference between said output signals;
    means responsive to said error signal for controlling said tracking band-pass filtering means; and
    means responsive to said error signal for deriving a demodulated signal.

2. A system for demodulating angle-modulated signals comprising:
    tracking band-pass filtering means supplied with an angle-modulated input signal, said filter means having a pass band with a center frequency which is variably controlled responsive to a control signal;
    first amplitude limiting means for limiting the amplitude of the angle-modulated input signal;
    phase-shifting means for establishing a phase difference of 90° between a signal passing through said tracking band-pass filtering means and a signal passing through said amplitude limiting means;
    phase comparing means responsive to the 90° phase difference signals for producing an output error signal in accordance with said phase difference;
    amplitude expansion means in a signal transmission system including a first amplitude limiting means, means whereby said amplitude expansion means lowers the level of the angle-modulated signals supplied to the phase comparing means responsive to levels of the input angle-modulated signals which are below a predetermined level;
    means responsive to said output error signal for controlling said tracking band-pass filtering means; and
    means responsive to said output error signal for deriving a demodulating signal.

3. A system for demodulating angle-modulated signals comprising:
    tracking band-pass filtering means supplied with an angle-modulated input signal, said filter means having a pass band with a center frequency which is variably controlled responsive to a control signal;
    first amplitude limiting means for limiting the amplitude of the angle-modulated input signal;
    phase-shifting means for establishing a phase difference of 90° between a signal passing through said tracking band-pass filtering means and a signal passing through said amplitude limiting means;
    phase comparing means responsive to the 90° phase difference signals for producing an output error signal in accordance with said phase difference;
    means responsive to said output error signal for controlling said tracking band-pass filtering means;
    envelope detecting means for generating a control signal responsive to a detection of the envelope of the input angle-modulated signal;
    loop gain controlling means for controlling the level of the output signal of the phase comparing means responsive to the control signal of the envelope detecting means;
    means for supplying the output of said loop gain controlling means to the tracking band-pass filtering means as the control signal; and
    means responsive to said output error signal for deriving a demodulated signal, said demodulated signal driving means including operation circuit means responsive to the output signal of the phase comparing means and the output signal of the loop gain controlling means for producing an output signal having a constant level.

4. A system for demodulating angle-modulated signals comprising:
    tracking band-pass filtering means supplied with an angle-modulated input signal, said filter means having a pass band with a center frequency which is variably controlled responsive to a control signal;
    first amplitude limiting means for limiting the amplitude of the angle-modulated input signal;

phase-shifting means for establishing a phase difference of 90° between a signal passing through said tracking band-pass filtering means and a signal passing through said amplitude limiting means;

first phase comparing means responsive to the 90° phase difference signals for producing an output error signal in accordance with said phase difference;

means responsive to said output error signal for controlling said tracking band-pass filtering means;

second phase comparing means for comparing the phase of the input angle-modulated signal to be supplied to the tracking band-pass filtering means and the phase of the output signal of the tracking band-pass filtering means, thereby producing an output signal responsive to the difference of both phases; and means responsive to said output error signal for deriving a demodulated signal.

5. A system for demodulating angle-modulated signals comprising:

tracking band-pass filtering means supplied with an angle-modulated input signal, said filter means having a pass band with a center frequency which is variably controlled responsive to a control signal;

first amplitude limiting means for limiting the amplitude of the angle-modulated input signal;

phase-shifting means for establishing a phase difference of 90° between a signal passing through said tracking band-pass filtering means and a signal passing through said amplitude means;

phase comparing means responsive to the 90° phase difference signals for producing an output error signal in accordance with said phase difference;

means responsive to said output error signal for controlling said tracking band-pass filtering means; and means responsive to said output error signal for deriving a demodulated signal, said demodulated signal deriving means including a double integral circuit for removing unnecessary carrier components and higher harmonics thereof from the output signal of the phase comparing means.

* * * * *